(12) United States Patent
Takeuchi et al.

(10) Patent No.: US 7,138,174 B2
(45) Date of Patent: Nov. 21, 2006

(54) PREPREG AND A LAMINATED SHEET

(75) Inventors: Kazumasa Takeuchi, Shimodate (JP); Yuko Tanaka, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 225 days.

(21) Appl. No.: 10/704,714

(22) Filed: Nov. 12, 2003

(65) Prior Publication Data

US 2004/0258899 A1    Dec. 23, 2004

(30) Foreign Application Priority Data

May 24, 2001    (JP)    ............................. 2001-155039
May 24, 2002    (JP)    ............................. 2002-150932

(51) Int. Cl.
*B05D 7/00*    (2006.01)
*B05D 3/00*    (2006.01)

(52) U.S. Cl. .................. 428/297.1; 428/221; 428/301.1

(58) Field of Classification Search ................ 428/221, 428/297.7, 301.1; 219/538, 543; 442/232
See application file for complete search history.

(56) References Cited

U.S. PATENT DOCUMENTS

| | | | | |
|---|---|---|---|---|
| 3,973,103 | A | * | 8/1976 | Tadewald .................... 219/543 |
| 4,032,751 | A | * | 6/1977 | Youtsey et al. ............. 219/538 |
| 6,156,870 | A | * | 12/2000 | Morita et al. ............... 528/353 |
| 6,252,010 | B1 | * | 6/2001 | Takeuchi et al. ............ 525/403 |
| 6,475,629 | B1 | * | 11/2002 | Takeuchi et al. ............ 428/450 |

* cited by examiner

*Primary Examiner*—N. Edwards
(74) *Attorney, Agent, or Firm*—Antonelli, Terry, Stout and Kraus, LLP.

(57) ABSTRACT

The present invention is directed to a prepreg comprising a fiber base material impregnated with a resin composition which comprises a polyamide-imide resin and a thermosetting resin as essential components, and a metal-clad laminated sheet obtained by pressing the prepreg and a metal foil having a surface roughness: Rz≦3.0 together while heating. In addition, the present invention provides a heat-resistant laminated sheet which is excellent in micro-wiring formation properties, thermal shock resistance, reflow resistance, and crack resistance.

27 Claims, 1 Drawing Sheet

PREPREG AND A LAMINATED SHEET

FIELD OF THE INVENTION

The present invention relates to a prepreg having excellent adhesion properties and excellent heat resistance, and a metal-clad laminated sheet.

BACKGROUND ART

A printed circuit is used in information terminal apparatuses, such as a personal computer and a portable phone. A laminated sheet for use in a printed wiring board constituting the printed circuit is prepared by impregnating a base material with an electrically insulating resin and curing the resin until it is in a B-stage to form a prepreg, and stacking the prepregs on one another and bonding them together. When forming the printed wiring board by a subtractive method, a metal-clad laminated sheet is used. The metal-clad laminated sheet is prepared by placing a metal foil, such as a copper foil, on the surface (one surface or both surfaces) of a prepreg and pressing them together while heating.

In recent years, as electronic communication apparatuses, e.g., information terminal apparatuses, such as a personal computer and a portable phone, are being spread, various demands have been made on the performance of the printed wiring board mounted on these apparatuses. Therefore, a prepreg and a prepreg material are requested to be improved in the properties in relation to the above demands. For example, electronic communication apparatuses are further reduced in weight, thickness, length, and size and further increased in speed and frequency. The technique for mounting chips is changed from a through-hole mount type to a surface mount type, and further to an area array type, typically ball grid array (BGA) using a plastic substrate. Recently, chip mounting is generally conducted by thermosonic wire bonding. A substrate on which chips are mounted is exposed to temperatures as high as 150° C. or more during the chip mounting, and therefore the substrate (substrate material) is required to have a certain heat resistance.

In addition, performance such that the mounted chip can be replaced, so-called repairability is demanded. In the replacement of chips, heat equivalent to that used in the above chip mounting is applied to the chip and the chip is removed, and then heat is applied again to the chip when remounting it. In this case, conventional insulating resins have a problem in that peeling may occur between a fiber base material and the resin. Therefore, the substrate required to have repairability is also required to have a thermal shock resistance including a resistance in thermal cycling at high temperatures.

Further, in accordance with the increase of the processing speed, the number of I/O in MPU is increased, and therefore the number of terminals connected thereto by wire bonding is increased and the terminal width is reduced. Thus, for improving the bonding strength between the prepreg and the metal foil on which circuits are formed and for forming even thinner wiring, a metal foil having a surface further finely roughened is desired.

In addition, as the frequency of the signal becomes higher, the circuit conductor is required to have surface smoothness. Magnetic lines of force are generated around a current which flows a conductor, and interference of the magnetic lines of force is most remarkable in the central portion of the conductor, and hence the current is concentrated on the periphery and end portions of the conductor. This is called a skin effect, and, the higher the frequency of the signal, the more remarkable the skin effect. It is considered that, when the surface of the conductor is smooth, the increase of the resistance due to the skin effect can be suppressed. However, the bonding strength between a conventional electrically insulating resin and a metal foil largely depends on the anchoring effect obtained mainly by the rough profile of the surface of the metal foil. For this reason, it has been difficult to achieve both the increase of the signal frequency and the improvement of the bonding strength.

As the electrically insulating resin, thermosetting resins, such as an epoxy resin, a phenolic resin, a polyimide resin, and a bismaleimide-triazine resin, have been generally used, and thermoplastic resins, such as a fluororesin and a polyphenylene ether resin, are also used. As the base material, glass, paper, and synthetic fiber are used. However, an epoxy resin has poor heat resistance and it is peeled off easily at the interface between glass and the resin due to heat, leading to a problem of the adhesion between the base material and the impregnating resin. Further, a polyimide resin has disadvantages in that the moldability and adhesion properties are poor and the curing temperature is high (about 250 to 400° C.). For example, the bonding strength of a polyamide-imide resin to the gloss surface of a metal, such as stainless steel, an iron-42 nickel alloy, or copper, or glass is lower than the practical level.

For example, Japanese Unexamined Patent Publication No. 181511/1991 has a description concerning a method for producing a polyamide-imide polymer in which (1) an aromatic tricarboxylic anhydride is reacted with a diamine having an ether linkage, and then the resultant product is reacted with (2) a diisocyanate. However, the polyamide-imide polymer obtained by such a method is likely to have a branched structure, and further a structure is formed in which the basic structures comprising an aromatic unit, an amide bond, and an imide ring are randomly arranged, and therefore it has a disadvantage in that the heat resistance and mechanical properties are unsatisfactory.

As mentioned above, with respect to the printed wiring board and the prepreg and the impregnating resin which are materials for the printed wiring board, it is desired that the heat resistance, the weathering resistance (thermal shock resistance indicated by heat cycle), and the adhesion properties which do not depend on the state of the rough profile of the surface of a metal foil are excellent.

An object of the present invention is to solve the above problems and to provide a prepreg which is advantageous not only in that it has excellent heat resistance and can be bonded to a smooth metal foil, but also in that the adhesion between the metal foil and the prepreg is excellent, and an insulating substrate, a metal-clad laminated sheet, and a printed wiring board as the use of the prepreg.

DISCLOSURE OF THE INVENTION

Specifically, the present invention is directed to a prepreg comprising a fiber base material impregnated with a resin composition which comprises a polyamide-imide resin and a thermosetting resin as essential components.

BEST MODE FOR CARRYING OUT THE INVENTION

The present invention is a prepreg comprising a fiber base material impregnated with a resin composition which comprises a polyamide-imide resin and a thermosetting resin as essential components. Specifically, it is preferred that the prepreg comprises a fiber base material impregnated with a resin composition which comprises, as essential components, a polyamide-imide resin, particularly a siloxane-modified polyamide-imide resin having a siloxane structure in the resin, and a thermosetting resin, particularly a resin having an organic group capable of being reacted with an amide group in the polyamide-imide resin, for example, an epoxy resin.

It is preferred that the siloxane-modified polyamide-imide resin in the present invention is a polyamide-imide resin obtained by reacting a diimidedicarboxylic acid with an aromatic isocyanate. In the present invention, it is more preferred that the siloxane-modified polyamide-imide resin is a siloxane-modified polyamide-imide resin obtained by reacting a diimidedicarboxylic acid obtained by reacting a diamine comprising a siloxane bond-containing diamine and optionally a diamine having three or more aromatic rings with trimellitic anhydride, with an aromatic diisocyanate, and that the thermosetting resin is an epoxy resin having two or more glycidyl groups. From the viewpoint of obtaining a siloxane-modified polyamide-imide resin having excellent flexibility, it is preferred that the siloxane-modified polyamide-imide resin is a siloxane-modified polyamide-imide resin obtained by reacting the diimidedicarboxylic acid obtained by reacting the diamine having a component molar ratio {(diamine having three or more aromatic rings)/(siloxane bond-containing diamine) molar ratio} of 99.9/0.1 to 0/100 with trimellitic anhydride so that the (diamine total mole)/(mole of the trimellitic anhydride) ratio is 1.0/2.0 to 1.0/2.2, with the aromatic diisocyanate so that the (diamine total mole)/(mole of the aromatic diisocyanate) ratio is 1.0/1.0 to 1.0/1.5.

It is further preferred that diimidedicarboxylic acid (1) in the present invention is a mixture which comprises a diimidedicarboxylic acid represented by the following formula (I):

(I)

wherein $R_1$ is represented by the following group:

wherein X is one group selected from the group consisting of the following groups:

; and a diimidedicarboxylic acid represented by the following formula (II):

(II)

wherein $R_2$ is represented by the following group:

wherein $R_3$ and $R_4$ are the same or different and individually represent a divalent organic group, $R_5$ to $R_8$ are the same or different and individually represent an alkyl group, a phenyl group, or a substituted phenyl group, and n is an integer of 1 to 50, preferably 3 to 40, especially preferably 5 to 40.

The diamine having three or more aromatic rings is optionally not used, but the siloxane bond-containing diamine is solely reacted with trimellitic anhydride to obtain a diimidedicarboxylic acid of formula (II) and it can be used as component (1). In the present invention, from the viewpoint of obtaining a siloxane-modified polyamide-imide resin having excellent flexibility, it is preferred to react components (1) and (2) with each other so that the molar ratio [{(a+b) total mole}/(mole of the aromatic diisocyanate) ratio] is in the range of from 1.0/1.0 to 1.0/1.5 to obtain a siloxane-modified polyamide-imide. Further, in the present invention, it is preferred to heat components (1) and (2) while stirring to effect a reaction at 120 to 200° C., advantageously at 140 to 180° C.

It is preferred that the siloxane-modified polyamide-imide resin in the present invention has a form of long chain, preferably has an aromatic unit, a siloxane unit, an amide bond, and an imide ring as basic structure units wherein these units are orderly repeated.

The diimidedicarboxylic acid in the present invention can be obtained by reacting a diamine comprising a siloxane bond-containing diamine and optionally a diamine having three or more aromatic rings with trimellitic anhydride. From the viewpoint of obtaining a siloxane-modified polyamide-imide resin having excellent flexibility, the diamine/trimellitic anhydride molar ratio is preferably 1.0/2.0 to 1.0/2.2, more preferably 1.0/2.0 to 1.0/2.15, further preferably 1.0/2.0 to 1.0/2.1. Further, it is preferred that the diimidedicarboxylic acid is obtained by reacting a mixture, which comprises (c) a diamine comprising (a) a diamine having three or more aromatic rings and (b) a siloxane bond-containing diamine, and a siloxane bond-containing diamine, with (d) trimellitic anhydride. In the present invention, from the viewpoint of obtaining a siloxane-modified polyamide-imide resin having excellent flexibility, the molar ratio {(a+b) total mole}/(mole of trimellitic anhydride) during the reaction of the component (c) with the component (d) is preferably 1.0/2.0 to 1.0/2.2, more preferably 1.0/2.0 to 1.0/2.15, further preferably 1.0/2.0 to 1.0/2.1.

Diamine (a) having three or more aromatic rings usable in the present invention is a diamine having three or more aromatic rings in the main chain. Examples include 2,2-bis[4-(4-aminophenoxy)phenyl]propane (hereinafter, referred to as "BAPP"), 2,2-bis[4-(4-aminophenoxy)phenyl]-hexafluoropropane, bis[4-(4-aminophenoxy)phenyl]methane, 1,3-bis(4-aminophenoxy)benzene, 1,4-bis(4-aminophenoxy)-benzene, bis[4-(3-aminophenoxy)phenyl] sulfone, bis[4-(4-aminophenoxy)phenyl] sulfone, 4,4'-bis(4-aminophenoxy)-biphenyl, bis[4-(4-aminophenoxy)phenyl] ether, and bis[4-(4-aminophenoxy)phenyl] ketone, and these can be used individually or in combination. From the viewpoint of achieving excellent balance between the properties of the polyamide-imide resin and the cost, preferred is BAPP.

In the present invention, examples of divalent organic groups include alkylene groups, such as methylene, ethylene, propylene, and butylene, and a phenylene group.

Examples of substituted phenyl groups include phenyl substituted with an alkylene group, such as o-methylphenyl, m-methylphenyl, p-methylphenyl, or o-ethylphenyl.

As siloxane bond-containing diamine (b) used in the present invention, preferred is one represented by the following formula (IV):

wherein $R_{10}$ and $R_{11}$ are the same or different and individually represent a divalent organic group, preferably an alkyl group, $R_{12}$ to $R_{15}$ represent an alkyl group, a phenyl group, or a substituted phenyl group, and p is an integer of 1 to 50, preferably 3 to 40, especially preferably 5 to 40.

In the present invention, as siloxane bond-containing diamine (b), a commercially available dimethylsiloxane diamine having amino groups at both terminals or the diamine of which part of the methyl groups is replaced by a phenyl group (dimethylsiloxane both-terminal amine) can be used. For example, the amine equivalent is preferably 120 to 2,200, more preferably 400 to 1,600. Examples of dimethylsiloxane both-terminal amines include amino-modified silicone oil: X-22-161AS (amine equivalent: 450), X-22-161A (amine equivalent: 840), and X-22-161B (amine equivalent: 1,500)(trade names; manufactured by Shin-Etsu Chemical Co., Ltd.); BY16-853 (amine equivalent: 650), and BY16-853B (amine equivalent: 2,200)(trade names; manufactured by Dow Corning Toray Silicone Co., Ltd.); and KF8010 (amine equivalent: 421)(trade name; manufactured by Shin-Etsu Chemical Co., Ltd.).

In the present invention, from the viewpoint of achieving both the increase of Tg and the reduction of the residual varnish solvent amount in the resin, it is preferred that the (diamine having three or more aromatic rings)/(siloxane bond-containing diamine) molar ratio is 99.9/0.1 to 0/100. It is preferred that the diamine having three or more aromatic rings and the siloxane bond-containing diamine are heated and mixed together in a polar solvent while stirring. Further, in the present invention, the {component (a)(diamine)}/{component (b)(siloxane bond-containing diamine)} molar ratio (a/b) is preferably 99.9/0.1≦(a/b)<0/100, especially preferably 95/5 to 30/70, further especially preferably 90/10 to 40/60. It is preferred that component (c) is obtained by heating and mixing together components (a) and (b) in a polar solvent while stirring.

In the present invention, trimellitic anhydride (d) can be obtained by a known method, and a commercially available product can be used. The purity is preferably 90% or higher, more preferably 95% or higher, especially preferably 98% or higher.

In the present invention, as specific examples of diimidedicarboxylic acids, there can be mentioned two types of diimidedicarboxylic acids having the following structures:

wherein q is 1 to 50, preferably 2 to 40, further preferably 3 to 40, especially preferably 5 to 40.

It is preferred that aromatic diisocyanate (2) in the present invention is an aromatic diisocyanate represented by the following formula (III):

$$OCN-R_9-NCO \quad (III)$$

wherein $R_9$ is one group selected from the group consisting of the following groups:

and

Examples of aromatic diisocyanates (2) used in the present invention include diphenylmethane 4,4'-diisocyanate (hereinafter, referred to simply as "MDI"), tolylene 2,4-diisocyanate, tolylene 2,6-diisocyanate, naphthalene 1,5-diisocyanate, and 2,4-tolylene dimer. These can be used individually or in combination.

In the present invention, preferred is a thermosetting resin having an organic group capable of being reacted with an amide group in the siloxane-modified polyamide-imide resin. Examples of the thermosetting resins used in the present invention include epoxy resins, polyimide resins, unsaturated polyester resins, polyurethane resins, bismaleimide resins, triazine-bismaleimide resins, and phenolic resins, and preferred are epoxy resins.

In the present invention, from the viewpoint of achieving excellent balance between the solvent resistance, the heat resistance, and the flexibility, relative to 100 parts by weight of the polyamide-imide resin, the thermosetting resin is preferably used in an amount of 1 to 200 parts by weight, more preferably 3 to 100 parts by weight, especially preferably 5 to 80 parts by weight.

The heat-resistant resin composition for forming a prepreg is a resin composition which comprises 100 parts by weight of a siloxane-modified polyamide-imide resin and 1 to 200 parts by weight of a thermosetting resin, and which can lower the residual solvent content to be 5% by weight or less even at a temperature as low as 150° C. or less such that the volatilization rate of a solvent in the varnish is large and the curing reaction of the thermosetting resin is not promoted, and a heat-resistant adhesive sheet having excellent adhesion properties to the fiber base material and a copper foil can be obtained therefrom. This is because a polyamide-imide resin having high heat resistance is modified with siloxane, and the residual solvent content can be lowered and therefore the occurrence of blistering due to the solvent volatilization in the step of stacking on the copper foil can be prevented, making it possible to improve the resistance to soldering heat.

It is preferred that the epoxy resin used in the present invention is an epoxy resin having a glycidyl group. An epoxy resin used as the thermosetting resin can be advantageously cured at a temperature of 180° C. or lower, and is reacted with an amide group in the siloxane-modified polyamide-imide resin to improve various properties including thermal, mechanical, and electrical properties. Further, it is preferred to use an epoxy resin having two or more glycidyl groups and a curing agent or a curing promoter therefor. The number of glycidyl groups is preferably larger, further preferably 3 or more. The amount of the epoxy resin incorporated depends on the number of glycidyl groups in the epoxy resin and hence, when the number of glycidyl groups is larger, the amount of the epoxy resin incorporated can be reduced. The (amide group in the siloxane-modified polyamide-imide resin)/(glycidyl group in the epoxy resin) ratio is preferably 1.0/0.1 to 1.0/5.0, more preferably 1.0/0.3 to 1.0/2.0, especially preferably 1.0/0.5 to 1.0/1.0.

As the epoxy resin, preferred is a liquid epoxy resin having high fluidity or an epoxy resin exhibiting a low viscosity when being heat-melted. Examples include for example bisphenol A epoxy resins; polyglycidyl ethers obtained by reacting polyhydric phenol, such as novolak phenolic resins, a o-cresol novolak phenolic resins, or polyhydric alcohol such as 1,4-butanediol, with epichlorohydrin, e.g., polyglycidyl esters obtained by reacting a polybasic acid, such as phthalic acid or hexahydrophthalic acid, with epichlorohydrin; N-glycidyl derivatives which are compounds having an amine, an amide, or a heterocyclic nitrogen base; and alicyclic epoxy resins, and preferred are bisphenol A epoxy resins. When using a liquid epoxy resin, the viscosity (at 25° C.) is preferably 10,000 cP or less, more preferably 200 to 8,000 cP. When using an epoxy resin (melting temperature: 50° C. or lower) which is in a solid state at room temperature, the melt viscosity is preferably 10,000 cP or less, more preferably 200 to 8,000 cP.

As the epoxy resin used in the present invention, preferred are EPIKOTE 152, EPIKOTE 806, EPIKOTE 807, EPIKOTE 828, EPIKOTE 834, EPIKOTE 1001, EPIKOTE 1004, EPIKOTE 1032H60, and EPIKOTE 190P (trade names, manufactured by Yuka Shell Epoxy Kabushiki Kaisha), NC3000S and NC3000S-H (trade names, manufactured by Nippon Kayaku Co., Ltd.), FX279B, ZX1548, ESN-165, YSLV-120TE, YD-127, YD-128, YH-434, YH-434L, YDF-170, YDCN-500, YDCN-701, and YDCN-8125 (trade names, manufactured by Tohto Kasei Co., Ltd.), and EPICRON830, EPICRON830S, EPICRON835, EPICRON835LV, N660, N665, EPICRON840, EPICRON850, EPICRON860, EPN-738, and EPN-770 (trade names, manufactured by Dainippon Ink & Chemicals Incorporated).

With respect to the curing agent or curing promoter for the epoxy resin used in the present invention, there is no particular limitation as long as it is reacted with the epoxy resin or it promotes curing of the epoxy resin. For example, an amine, an imidazole, a multifunctional phenol, or an acid anhydride can be used. As the amine, dicyandiamide, diaminodiphenylmethane, or guanyl urea can be used; as the multifunctional phenol, hydroquinone, resorcinol, bisphenol A, a halogen compound of these, or a novolak phenolic resin or resol phenolic resin which is a condensation product of formaldehyde and these can be used; and, as the acid anhydride, phthalic anhydride, benzophenonetetracarboxylic dianhydride, or methyl endomethylene tetrahydrophthalic anhydride can be used. As the curing promoter, an alkyl group-substituted imidazole or benzimidazole as an imidazole can be used.

With respect to the amount of the curing agent or curing promoter required, in amines, preferred is an amount such that the equivalent of active hydrogen in the amine and the epoxy equivalent of the epoxy resin are substantially the same. In imidazoles as the curing promoter, the amount cannot be represented simply by the equivalent ratio between the epoxy resin and active hydrogen and, experimentally, 0.001 to 10 parts by weight of the imidazole is needed, relative to 100 parts by weight of the epoxy resin. In multifunctional phenols or acid anhydrides, from the viewpoint of achieving excellent balance between Tg and insulation properties, a phenolic hydroxyl group or a carboxyl group is needed in an amount 0.6 to 1.2 times the equivalent of the epoxy resin.

In addition to the above-mentioned components, filler, a coloring agent, an antioxidant, a reducing agent, and an ultraviolet light screening agent can be added in an amount such that the effect aimed at by the present invention is not sacrificed. Especially inorganic filler is effective to improve the flame retardancy. These may be used individually or in combination.

The prepreg of the present invention can be prepared by impregnating a fiber base material with a varnish which is obtained by mixing, dissolving, or dispersing the heat-resistant resin composition in the present invention in an organic solvent and drying the resultant impregnated material. With respect to the conditions for the preparation of the prepreg, there is no particular limitation. It is preferred that 80% by weight or more of the solvent used in the varnish volatilizes. With respect to the conditions for drying in the preparation of the prepreg, the drying temperature may be 80 to 180° C., and the drying time can be appropriately selected according to the desired prepreg properties while taking the gelation time for the varnish into consideration.

With respect to the base material, there is no particular limitation as long as it can be used in preparation of metal-clad laminated sheets or multilayer printed wiring boards. A fiber base material, such as woven fabric or nonwoven fabric, can be used. Examples of forms of the base material include woven fabric, nonwoven fabric, fiber, and whisker. Examples of materials for the base material include glass, such as silica alumina glass, and silica glass; inorganic materials, such as alumina, asbestos, boron, silicon carbide, silicon nitride, and zirconia; natural or synthetic organic materials, such as aramid, polyether ether ketone, polyether imide, polyether sulfone, carbon, and cellulose; and mixtures of these, and preferred is glass. Glass cloth is preferred, more preferably woven fabric comprised of glass fiber, and the thickness is preferably 10 to 200 μm.

With respect to the organic solvent used in the preparation of a varnish of the heat-resistant resin composition in the present invention, there is no particular limitation as long as solubility can be obtained. Examples include dimethylacetamide, dimethylformamide, dimethyl sulfoxide, N-methyl-2-pyrrolidone, γ-butyrolactone, sulfolane, and cyclohexanone.

In the present invention, the amount of the impregnating resin is indicated by a resin content, and the resin content is a ratio of the total weight of the organic resin solids and the inorganic filler to the weight of the prepreg, and it is preferably 30 to 80% by weight, more preferably 40 to 70% by weight. The resin content can be appropriately determined according to the desired prepreg performance and the thickness of the insulating layer stacked. Further, it is preferred that the amount of the impregnating varnish is adjusted so that the varnish solids content becomes 35 to 70% by weight, based on the total weight of the varnish solids and the base material.

The method for preparing an insulating sheet, a laminated sheet, or a metal-clad laminated sheet obtained by pressing the prepreg of the present invention while heating is as follows. According to the use, on one surface or both surfaces of the prepreg of the present invention or a laminated product comprising a plurality of the prepregs stacked on one another is placed a metal foil, and they are together pressed while heating to a temperature generally in the range of 150 to 280° C., preferably 180 to 250° C., under a pressure generally in the range of 0.5 to 20 MPa, preferably 1 to 8 MPa, to prepare an insulating sheet, a laminated product, or a metal-clad laminated product. When a metal-clad laminated sheet is formed using a metal foil, a printed wiring circuit board can be prepared by subjecting the metal-clad laminated sheet to circuit processing.

As the metal foil used in the present invention, a copper foil or an aluminum foil is generally used, and a 5- to 200-μm metal foil generally used in a laminated sheet can be used. Alternatively, a 3-layer structure composite foil comprising a 0.5- to 15-μm copper layer and a 10- to 300-μm copper layer formed respectively on either surfaces of an intermediate layer comprised of nickel, nickel-phosphorus, a nickel-tin alloy, a nickel-iron alloy, lead, or a lead-tin alloy, or a 2-layer structure composite foil comprising aluminum and copper foils can be used.

In the present invention, when Rz is used as an index of the surface roughness of a metal foil, Rz preferably satisfies the relationship: Rz≦3.0, more preferably Rz≦2.0. For improving the adhesion properties of a metal foil to a bonding resin, such as a prepreg, one surface or both surfaces of the metal foil are often subjected to surface roughening treatment to form a finely uneven surface.

Examples of indices of the surface roughness include arithmetic mean roughness Ra, square mean roughness Rq, and 10-point mean roughness Rz used in ISO and JIS. The smaller the values, the smaller the surface roughness, i.e., smoother. Specifically, the prepreg of the present invention and a metal foil having a smooth surface can be used in combination. Further, the surface of such a metal may be subjected to anticorrosion treatment or adhesion treatment using a coupling agent, but the metal foil can be used, irrespective of these treatments.

Figure 1A:
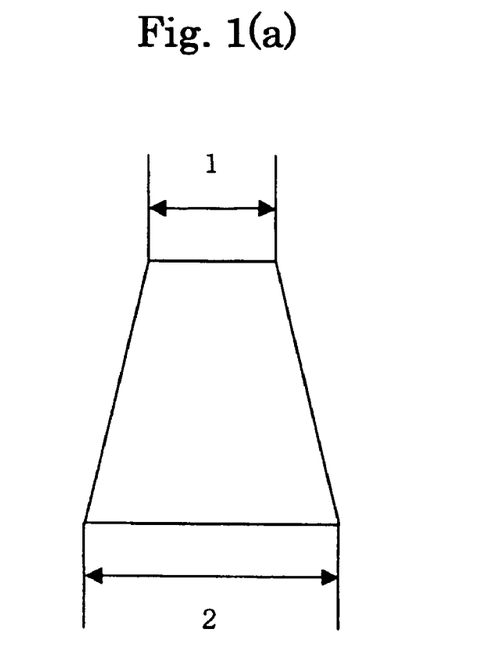
FIG. 1(a) is a diagrammatic cross-sectional view of a circuit formed on a metal-clad laminated sheet. In the figure, reference numeral 1 designates a top width (Wt) of the circuit, and reference numeral 2 designates a bottom width (Wb) of the circuit.
Figure 1B:
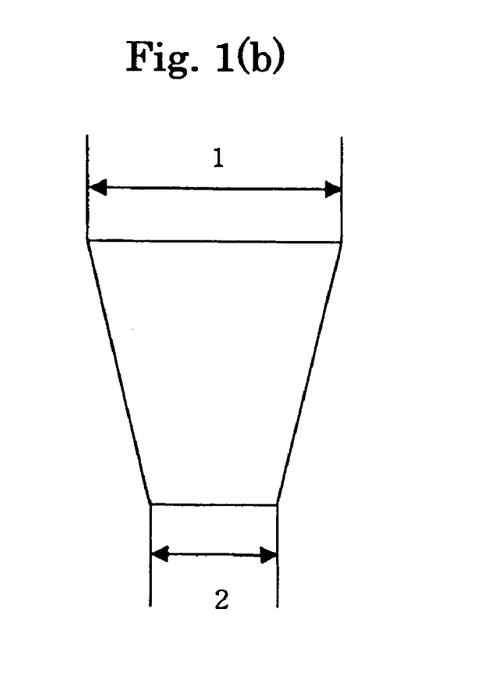
FIG. 1(b) is a diagrammatic cross-sectional view of a circuit formed on a metal-clad laminated sheet. In the figure, reference numeral 1 designates a top width (Wt) of the circuit, and reference numeral 2 designates a bottom width (Wb) of the circuit.

When the metal-clad laminated sheet is subjected to circuit processing to form a circuit, the cross-sectional shape of the circuit obtained can be used as an index for evaluation of the circuit formation properties of the metal-clad laminated sheet. This is described in more detail with reference to the diagrammatic cross-sectional views (FIG. 1) of the circuit formed on the metal-clad laminated sheet. The cross-sectional shape of the circuit varies depending on the surface properties of the metal foil, especially the shape of the rough profile of the surface of the metal foil, and the cross-sectional shape of the circuit obtained can be evaluated by a ratio of bottom width Wb to top width Wt of the circuit (Wb/Wt). In the present invention, the circuit formation properties of the metal-clad laminated sheet are evaluated by the cross-sectional shape of the circuit obtained. Therefore, for improving the circuit formation properties (cross-sectional shape of the circuit), it is effective to select a smooth metal foil so that the etching in the circuit processing can be made uniformly. However, a conventional prepreg has only unsatisfactory adhesion properties to a metal foil having a smooth surface. For this reason, a metal foil having no smooth surface is used in the metal-clad laminated sheet, thus lowering the circuit formation properties. In addition, when the circuit width is small, the yield of the resultant printed wiring board is low.

In the evaluation of the circuit formation properties, from the ratio of the bottom width to the top width of the circuit (Wb/Wt), the below-described findings on the cross-sectional shape of the circuit and the circuit performance can be obtained. The large ratio of the bottom width to the top width of the circuit (Wb/Wt) indicates that the top width of the circuit is small, as compared to the bottom width {FIG. 1(a)}. In contrast, the small ratio (smaller than 1) of the bottom width to the top width of the circuit (Wb/Wt) indicates that the top width of the circuit is large, as compared to the bottom width {FIG. 1(b)}. In both cases, it is considered that the cross-section area of the circuit is different from the design value and the resistance value is different from the design value, and the circuit in the outermost layer is lowered in the accuracy in mounting of parts.

In the circuit having a rectangular circuit cross-section like the metal-clad laminated sheet using the prepreg of the present invention, it is expected that the cross-section area of the circuit is almost equal to the design value and the resistance value is equivalent to the design value and stable, and the circuit in the outermost layer is improved in the accuracy in mounting of parts. From this, it is apparent that, even when the circuit width is small, a printed wiring board can be produced in high yield from the metal-clad laminated sheet using the prepreg of the present invention. Therefore, in the present invention, it is preferred that the top width and the bottom width of the circuit are substantially the same.

Hereinbelow, the present invention will be described with reference to the following Examples, which should not be construed as limiting the scope of the present invention.

EXAMPLES

Synthesis Example 1

Into a separable flask having a capacity of 1 liter and being equipped with a 25 ml moisture measuring receiver having a stopcock connected to a reflux condenser, a thermometer, and a stirrer were charged 57.5 g (0.14 mol) of 2,2-bis[4-(4-aminophenoxy)phenyl]propane (BAPP) as a diamine having three or more aromatic rings, 50.5 g (0.06 mol) of reactive silicone oil KF8010 (trade name; manufactured by Shin-Etsu Chemical Co., Ltd.; amine equivalent: 421) as a siloxane bond-containing diamine, 80.7 g (0.42 mol) of trimellitic anhydride (TMA), and 580 g of N-methyl-2-pyrrolidone (NMP) as an aprotic polar solvent, and the mixture was stirred at 80° C. for 30 minutes. Then, 100 ml of toluene as an aromatic hydrocarbon which can undergo azeotropy with water was added to the resultant mixture, and then the temperature was elevated and the mixture was heated under reflux at about 160° C. for 2 hours. It was confirmed that about 7.2 ml or more of a water fraction of the distillate was left in the moisture measuring receiver and no further water fraction of the distillate was found. Then, while removing the distillate left in the moisture measuring receiver, the temperature was elevated to about 190° C. to remove toluene. Then, the solution was cooled to room temperature, and 60.1 g (0.24 mol) of 4,4'-diphenylmethane diisocyanate (MDI) as an aromatic diisocyanate was added to effect a reaction at 190° C. for 2 hours. After completion of the reaction, NMP solution (A) of a siloxane-modified polyamide-imide resin was obtained.

Synthesis Example 2

Substantially the same procedure as in Synthesis Example 1 was repeated except that 41.1 g (0.10 mol) of BAPP, 84.2 g (0.10 mol) of reactive silicone oil KF8010 (trade name; manufactured by Shin-Etsu Chemical Co., Ltd.; amine equivalent: 421), and 620 g of NMP were used to obtain NMP solution (B) of a siloxane-modified polyamide-imide resin.

Synthesis Example 3

Substantially the same procedure as in Synthesis Example 1 was repeated except that 16.4 g (0.04 mol) of BAPP, 134.7 g (0.16 mol) of reactive silicone oil KF8010 (trade name; manufactured by Shin-Etsu Chemical Co., Ltd.; amine equivalent: 421), and 542 g of NMP were used to obtain NMP solution (C) of a siloxane-modified polyamide-imide resin.

Synthesis Example 4

Substantially the same procedure as in Synthesis Example 1 was repeated except that 73.9 g (0.18 mol) of BAPP, 62.4 g (0.02 mol) of reactive silicone oil X-22-161B (trade name; manufactured by Shin-Etsu Chemical Co., Ltd.; amine equivalent: 1,560) as a siloxane bond-containing diamine, and 542 g of NMP were used to obtain NMP solution (D) of a siloxane-modified polyamide-imide resin.

Example 1

200 g of NMP (A) solution of the siloxane-modified polyamide-imide resin (resin solids content: 30% by weight) in Synthesis Example 1, 120 g of an epoxy resin (YDCN- 500, trade name; manufactured by Tohto Kasei Co., Ltd.; cresol novolak epoxy resin)(dimethylacetamide solution having a resin solids content of 50% by weight), and 0.8 g of 2-ethyl-4-methylimidazole were mixed together, and stirred for about 1 hour until the resin became uniform, and then allowed to stand at room temperature for 24 hours for defoaming to obtain heat-resistant resin composition varnish (1).

Example 2

Substantially the same procedure as in Example 1 was repeated except that 200 g of NMP (B) solution of the siloxane-modified polyamide-imide resin (resin solids content: 30% by weight) in Synthesis Example 2 was used to obtain heat-resistant resin composition varnish (2).

Example 3

Substantially the same procedure as in Example 1 was repeated except that 200 g of NMP (C) solution of the siloxane-modified polyamide-imide resin (resin solids content: 30% by weight) in Synthesis Example 3, and 120 g of an epoxy resin (ESCN195, trade name; manufactured by Sumitomo Chemical Co., Ltd.; cresol novolak epoxy resin) (dimethylacetamide solution having a resin solids content of 50% by weight) were used to obtain heat-resistant resin composition varnish (3).

Example 4

Substantially the same procedure as in Example 1 was repeated except that 200 g of NMP (B) solution of the siloxane-modified polyamide-imide resin (resin solids content: 30% by weight) in Synthesis Example 2, and 120 g of an epoxy resin (DER331L, trade name; manufactured by Dow Chemical Company; bisphenol A epoxy resin) (dimethylacetamide solution having a resin solids content of 50% by weight) were used to obtain heat-resistant resin composition varnish (4).

Example 5

Substantially the same procedure as in Example 1 was repeated except that 200 g of NMP (B) solution of the siloxane-modified polyamide-imide resin (resin solids content: 30% by weight) in Synthesis Example 2, and 120 g of an epoxy resin (ZX-1548-2, trade name; manufactured by Tohto Kasei Co., Ltd.; phosphorus-containing epoxy resin) (dimethylacetamide solution having a resin solids content of 50% by weight) were used to obtain heat-resistant resin composition varnish (5).

Example 6

Substantially the same procedure as in Example 1 was repeated except that 200 g of NMP (D) solution of the siloxane-modified polyamide-imide resin (resin solids content: 30% by weight) in Synthesis Example 4, 30 g of an epoxy resin (ZX-1548-2, trade name; manufactured by Tohto Kasei Co., Ltd.; phosphorus-containing multifunctional epoxy resin) (dimethylacetamide solution having a resin solids content of 50% by weight), and 0.2 g of 2-ethyl-4-methylimidazole were used to obtain heat-resistant resin composition varnish (6).

Comparative Example 1

50 Parts by weight of a brominated bisphenol A epoxy resin (ESB400T, manufactured by Sumitomo Chemical Co., Ltd.; epoxy equivalent: 400), 50 parts by weight of an ortho-cresol novolak epoxy resin (ESCN195, manufactured by Sumitomo Chemical Co., Ltd.; epoxy equivalent: 195), 42 parts by weight of a phenolic novolak resin (HP850N, manufactured by Hitachi Chemical Co., Ltd.; hydroxyl group equivalent: 108), 0.5 part by weight of 2-ethyl-4-methylimidazole, and methyl ethyl ketone and ethylene glycol monomethyl ether were mixed together to prepare a comparative varnish having a solids content of 50% by weight.

(Preparation of prepreg and metal-clad laminated sheet)

Preparation of prepreg

Glass cloth (Style 2116, E-glass) having a thickness of about 0.1 mm was impregnated individually with the varnishes (1 to 6) prepared in Examples 1 to 6, and then dried by heating to 150° C. for 15 minutes to obtain prepregs (1 to 6) having a resin content of 40% by weight.

A comparative prepreg was obtained in substantially the same manner as that described above except that the comparative varnish in Comparative Example 1 was used.

Preparation of metal-clad laminated sheet (Metal-clad laminated sheet a)

Four sheets of each of the above-obtained prepregs (1 to 6) were stacked on one another, and electrolytic copper foils each having a thickness of 12 μm (USLP-12, manufactured by Nippon Denkai, Ltd.; Rz=1.7; hereinafter, referred to simply as "USLP-12") were placed on both sides of the resultant stacked sheet so that the rough profile of the surface of the foil faced the prepreg, and pressed together under pressing conditions at 230° C. under 4.0 MPa for 90 minutes to prepare double-sided copper-clad laminated sheets a.

(Metal-clad laminated sheet b)

Four sheets of each of the above-obtained prepregs (1 to 6) were stacked on one another, and electrolytic copper foils each having a thickness of 12 μm (F0-WS, manufactured by Furukawa Circuit Foil Co., Ltd.; Rz=1.5; hereinafter, referred to simply as "F0-WS") were placed on both sides of the resultant stacked sheet, and pressed together under pressing conditions at 230° C. under 4.0 MPa for 90 minutes to prepare double-sided copper-clad laminated sheets b.

(Comparative laminated sheets a and b)

Substantially the same procedure as in the preparation of the above metal-clad laminated sheets a and b was repeated except that the comparative prepreg was used to obtain comparative laminated sheets a and b.

With respect to the obtained double-sided copper-clad laminated sheets 1 to 6 and comparative double-sided copper-clad laminated sheet 1, a peeling strength, a resistance to soldering heat, and a thermal shock resistance were measured, and the results were shown in Tables 1 and 2.

The obtained double-sided metal-clad laminated sheets were tested by the methods described below and evaluated.

Peeling strength: An adhesive tape having a width of 10 mm was placed on the outer layer copper foil and etched, and then the tape was peeled off to form a pattern having a width of 10 mm. This pattern was peeled in the direction of 90° at a peeling speed of 50 mm.min$^{-1}$ using a tensile tester (Autograph S-100, manufactured by Shimadzu Corporation), and a force needed to peel the pattern was taken as a peeling strength (kN/m).

Resistance to soldering heat: A laminated sheet was dipped individually in solder baths at 260° C., 288° C., and 300° C. and a resistance to soldering heat was measured in accordance with JIS C 5012 10.4.

Thermal shock resistance test (by heat cycle): In a heat cycle test under IR reflow conditions, a cycle was repeated in which a substrate was heated from room temperature to 260° C. over 5 minutes using an IR heating oven and then the substrate was gradually cooled to room temperature, and the resultant substrate was visually inspected to know as to whether or not an unfavorable change occurred.

With respect to the resistance to soldering heat and the thermal shock resistance test, the appearance was observed in respect of an unfavorable change, such as blistering or peeling, and symbol ○ indicates that no unfavorable change occurred and symbol X indicates that blistering or peeling, i.e., an unfavorable change occurred.

TABLE 1

Table 1: Evaluation of properties of double-sided metal-clad laminated sheet (No. 1)

| Test item | Example 1 | | Example 2 | | Example 3 | | Example 4 | |
|---|---|---|---|---|---|---|---|---|
| | 1a | 1b | 2a | 2b | 3a | 3b | 4a | 4b |
| Peeling strength (kN/m) | 1.2 | 1.0 | 1.2 | 0.9 | 1.2 | 0.8 | 1.2 | 1.0 |
| Resistance to soldering heat (s) | >300 ○ | >300 ○ | >300 ○ | >300 ○ | >300 ○ | >300 ○ | >300 ○ | >300 ○ |
| Thermal shock resistance (at 20th cycle) | ○ | ○ | ○ | ○ | ○ | ○ | ○ | ○ |

TABLE 2

Table 2: Evaluation of properties of double-sided metal-clad laminated sheet (No. 2)

| Test item | Example 5 | | Example 6 | | Comparative Example 1 | |
|---|---|---|---|---|---|---|
| | 5a | 5b | 6a | 6b | Comp. 1a | Comp. 1b |
| Peeling strength(kN/m) | 1.2 | 1.1 | 1.2 | 1.1 | 0.8 | 0.3 |
| Resistance to soldering heat(s) | >300 ○ | >300 ○ | >300 ○ | >300 ○ | <120 X | 10 X |
| Thermal shock resistance (at 20th cycle) | ○ | ○ | ○ | ○ | At 2nd cycle X | At 2nd cycle X |

(Evaluation)

As a result of the measurement of metal foil bonding strength (peeling strength) with respect to the metal-clad laminated sheets obtained, it was found that, in the combination of USLP-12 and the individual prepregs in Examples 1 to 6, the metal foil bonding strength was 1.0 to 1.4 kN/m. In addition, in the combination of F0-WS and the individual prepregs in Examples 1 to 6, the metal foil bonding strength was 0.9 to 1.2 kN/m.

In Examples 1 to 6, as a result of the measurement of resistance to soldering heat by dipping in the solder baths at 260° C., 288° C., and 300° C., it was found that, after a lapse of 5 minutes or more, an unfavorable change, such as blistering or peeling, was not observed at each temperature.

By contrast, in Comparative Example 1, the bonding strength between the copper foil and the adhesive surface was 0.3 to 0.4 kN/m when using electrolytic surface-roughened foil USLP-12, and 0.2 to 0.4 kN/m when using electrolytic copper foil F2-WS. These copper foil-clad laminated sheets were dipped in the solder baths at 260° C., 288° C., and 300° C. in the same manner as in the copper foil-clad laminated sheets prepared using Examples 1 to 6, and blistering occurred in the copper foil within 2 minutes. In addition, the copper foil-clad laminated sheet was low in the bonding strength and poor in the resistance to soldering heat and the thermal shock resistance.

Circuit formation properties of copper-clad laminated sheet

The circuit formation properties of the copper-clad laminated sheet were tested using copper foils (USLP-12 and FO-WS) having different degrees of surface roughness.

In Examples 1 to 6, the above metal-clad laminated sheets a and b were used.

In Comparative Example 1, the above comparative metal-clad laminated sheets a and b were used.

Evaluation of circuit formation properties:

A resist layer was formed on each of the copper foil-clad laminated sheets in Examples 1 to 6 and Comparative Examples 1 and 2, and subjected to exposure and development to form a comb-form pattern having L/S of 20 µm/20 µm, 30 µm/30 µm, 40 µm/40 µm, and 50 µm/50 µm, and an unnecessary portion of copper was etched away using an aqueous ferric chloride solution, and then the resist was peeled off to form a circuit. In this circuit forming method, basically, the top width is not extremely larger than the bottom width.

The circuit obtained was examined through an optical microscope connected to an image processing system to measure top width Wt and bottom width Wb of the circuit, and evaluated with respect to the ratio (Wb/Wt). In the evaluation of the substrate using this 12 µm copper foil, symbol ○ indicates Wb/Wt≦1.4, symbol Δ indicates 1.4<Wb/Wt<1.7, and symbol X indicates Wb/Wt≧1.7.

The larger top width/bottom width ratio of the circuit means that the top width is small, as compared to the bottom width, and the circuit cross-section is considered to be semicylindrical.

The results are shown in Tables 3 and 4.

TABLE 3

Table 3: Evaluation of circuit formation properties of double-sided metal-clad laminated sheet (No. 1)

| Test item | Example 1 | | Example 2 | | Example 3 | | Example 4 | |
|---|---|---|---|---|---|---|---|---|
| | 1a | 1b | 2a | 2b | 3a | 3b | 4a | 4b |
| Circuit formation properties 20 µm/20 µm | ○ | ○ | ○ | ○ | ○ | ○ | ○ | ○ |
| Circuit formation properties 30 µm/30 µm | ○ | ○ | ○ | ○ | ○ | ○ | ○ | ○ |
| Circuit formation properties 40 µm/40 µm | ○ | ○ | ○ | ○ | ○ | ○ | ○ | ○ |
| Circuit formation properties 50 µm/50 µm | ○ | ○ | ○ | ○ | ○ | ○ | ○ | ○ |

TABLE 4

Table 4: Evaluation of circuit formation properties of double-sided metal-clad laminated sheet (No. 2)

| Test item | Example 5 | | Example 6 | | Comparative Example 1 | |
|---|---|---|---|---|---|---|
| | 5a | 5b | 6a | 6b | Comp. 1a | Comp. 1b |
| Circuit formation properties 20 μm/20 μm | ○ | ○ | ○ | ○ | X | X |
| Circuit formation properties 30 μm/30 μm | ○ | ○ | ○ | ○ | X | X |
| Circuit formation properties 40 μm/40 μm | ○ | ○ | ○ | ○ | Δ | Δ |
| Circuit formation properties 50 μm/50 μm | ○ | ○ | ○ | ○ | ○ | Δ |

With respect to the copper foil-clad laminated sheets using Examples 1 to 6, in each of the copper foils having Rz=1.5 and 1.7, the residual copper could be removed in a short time, and the circuit cross-section was nearly rectangular. Further, no peeling was found in the circuit. In the circuit formation properties, L/S of 20 μm/20 μm could be achieved.

Therefore, by using the prepreg of the present invention, a laminated sheet having a conductor (circuit) having a smooth surface can be prepared using a copper foil having a surface finely roughened.

In such a circuit having a rectangular circuit cross-section, it is expected that the cross-section area of the circuit is almost equal to the design value and the resistance value is equivalent to the design value and stable, and the circuit in the outermost layer is improved in the accuracy in mounting of parts. Particularly, when the circuit width is small, the yield is conventionally low, but this problem can be solved.

By contrast, in the copper foil-clad laminated sheet in Comparative Example 1, a circuit could not be formed partially.

In the circuit having a semicylindrical circuit cross-section, it is considered that the cross-section area of the circuit is different from the design value and the resistance value is different from the design value, and the circuit in the outermost layer is lowered in the accuracy in mounting of parts.

Thus, the circuit formation properties of the metal-clad laminated sheet depend on the surface properties of the copper foil used, especially smoothness of the surface. For improving the circuit formation properties, it is effective to select a smooth metal foil.

INDUSTRIAL APPLICABILITY

The prepreg of the present invention has excellent heat resistance and excellent adhesion properties to a smooth metal foil. Further, the insulating substrate, metal-clad laminated sheet, and printed wiring board obtained using the prepreg of the present invention are excellent in resistance to soldering heat and thermal shock resistance (heat resistance, reflow resistance, and crack resistance). In addition, the metal-clad laminated sheet and printed wiring board obtained using the prepreg of the present invention are excellent in circuit formation properties (micro-wiring formation properties).

What is claimed is:

1. A metal-clad laminated sheet which is obtained by pressing a prepreg and a metal foil having a surface roughness Rz≦3.0 together while heating, wherein the prepreg comprises a fiber base material impregnated with a resin composition which comprises a polyamide-imide resin that is siloxane-modified and a thermosetting resin as essential components.

2. The metal-clad laminated sheet according to claim 1, wherein said fiber base material is glass cloth.

3. The metal-clad laminated sheet according to claim 1, wherein said thermosetting resin is a resin having an organic group capable of being reacted with an amide group in said polyamide-imide resin.

4. The metal-clad laminated sheet according to claim 3, wherein said polyamide-imide resin is a siloxane-modified polyamide-imide resin obtained by reacting
   a diimidedicarboxylic acid obtained by reacting a diamine comprising a siloxane bond-containing diamine and optionally a diamine having three or more aromatic rings with trimellitic anhydride,
   with an aromatic diisocyanate.

5. The metal-clad laminated sheet according to claim 4, wherein said polyamide-imide resin is a siloxane-modified polyamide-imide resin obtained by reacting
   said diimidedicarboxylic acid obtained by reacting said diamine having a component molar ratio {(diamine having three or more aromatic rings)/(siloxane bond-containing diamine) molar ratio} of 99.9/0.1 to 0/100 with said trimellitic anhydride so that the (diamine total mole)/(mole of said trimellitic anhydride) ratio is 1.0/2.0 to 1.0/2.2,
   with said aromatic diisocyanate
   so that the (diamine total mole)/(mole of said aromatic diisocyanate) ratio is 1.0/1.0 to 1.0/1.5.

6. The metal-clad laminated sheet according to claim 1, wherein said polyamide-imide resin is a siloxane-modified polyamide-imide resin obtained by reacting:
   (1) a mixture containing
   a diimidedicarboxylic acid represented by the following formula (I):

wherein $R_1$ is represented by the following group:

wherein X is one group selected from the group consisting of the following groups:

; and a diimidedicarboxylic acid represented by the following formula (II):

wherein $R_2$ is represented by the following group:

wherein $R_3$ and $R_4$ are the same or different and individually represent a divalent organic group, $R_5$ to $R_8$ are the same or different and individually represent an alkyl group, a phenyl group, or a substituted phenyl group, and n is an integer of 1 to 50 which are obtained by reacting

(c) a mixture of (a) a diamine having three or more aromatic rings and (b) a siloxane bond-containing diamine with (d) trimellitic anhydride, with (2) an aromatic diisocyanate represented by the following formula (III):

$$OCN-R_9-NCO \qquad (III)$$

wherein $R_9$ is one group selected from the group consisting of the following groups:

7. The metal-clad laminated sheet according to claim 6, wherein said siloxane-modified polyamide-imide resin is a siloxane-modified polyamide-imide resin obtained by reacting:

(1) a mixture which is obtained by reacting said component (c) having a {said component (a)/said component (b)} molar ratio: $99.9/0.1 \leqq (a/b) < 0/100$ with said component (d) so that the {(a+b) total mole}/(mole of trimellitic anhydride) ratio is 1.0/2.0 to 1.0/2.2, and which comprises said diimidedicarboxylic acids represented by the formula (I) and the formula (II)

with (2) said aromatic diisocyanate represented by the formula (III) so that the {(a+b) total mole}/(mole of said aromatic diisocyanate) ratio is 1.0/1.0 to 1.0/1.5.

8. The metal-clad laminated sheet according to claim 7, wherein said (a/b) is 95/5 to 30/70.

9. The metal-clad laminated sheet according to claim 1, wherein said thermosetting resin is an epoxy resin.

10. The metal-clad laminated sheet according to claim 1, wherein said thermosetting resin is an epoxy resin having two or more glycidyl groups.

11. The metal-clad laminated sheet according to claim 1, wherein said thermosetting resin is a resin containing an epoxy resin having two or more glycidyl groups and a curing promoter or a curing agent.

12. A metal-clad laminated sheet which is obtained by pressing a prepreg and a metal foil together, the prepreg comprising a fiber base material impregnated with a resin composition which comprises a siloxane-modified polyamide-imide resin and an epoxy resin as essential components.

13. A metal-clad laminated sheet which is obtained by pressing a prepreg and a metal foil together, the prepreg comprising a fiber base material impregnated with a resin composition which comprises a siloxane-modified polyamide-imide resin and an epoxy resin having two or more glycidyl groups as essential components, wherein said siloxane-modified polyamide-imide resin is a siloxane-modified polyamide-imide resin obtained by reacting a diimidedicarboxylic acid obtained by reacting a diamine comprising a siloxane bond-containing diamine and optionally a diamine having three or more aromatic rings with trimellitic anhydride, with an aromatic diisocyanate.

14. The metal-clad laminated sheet according to claim 13, wherein said siloxane-modified polyamide-imide resin is a siloxane-modified polyamide-imide resin obtained by reacting said diimidedicarboxylic acid obtained by reacting said diamine having a component molar ratio {(diamine having three or more aromatic rings)/(siloxane bond-containing diamine) molar ratio} of 9.99/0.1 to 0/100 with said trimellitic anhydride so that the (diamine total mole)/(mole of said trimellitic anhydride) ratio is 1.0/2.0 to 1.0/2.2, with said aromatic diisocyanate so that the (diamine total mole)/(mole of said aromatic diisocyanate) ratio is 1.0/1.0 to 1.0/1.5.

15. The metal-clad laminated sheet according to claim 12, wherein said polyamide-imide resin is a siloxane-modified polyamide-imide resin obtained by reacting:

(1) a mixture containing a diimidedicarboxylic acid represented by the following formula (I):

(I)

wherein $R_1$ is represented by the following group:

wherein X is one group selected from the group consisting of the following groups:

and

; and a diimidedicarboxylic acid represented by the following formula (II):

(II)

wherein $R_2$ is represented by the following group:

wherein $R_3$ and $R_4$ are the same or different and individually represent a divalent organic group, $R_5$ to $R_8$ are the same or different and individually represent an alkyl group, a phenyl group, or a substituted phenyl group, and n is an integer of 1 to 50 which are obtained by reacting

(c) a mixture of (a) a diamine having three or more aromatic rings and (b) a siloxane bond-containing diamine with (d) trimellitic anhydride, with (2) an aromatic diisocyanate represented by the following formula (III):

OCN—$R_9$—NCO  (III)

wherein $R_9$ is one group selected from the group consisting of the following groups:

16. The metal-clad laminated sheet according to claim 15, wherein said siloxane-modified polyamide-imide resin is a siloxane-modified polyamide-imide resin obtained by reacting:

(1) a mixture which is obtained by reacting said component (c) having a {said component (a)/said component (b)} molar ratio: 99.9/0.1≦(a/b)<0/100 with said component (d) so that the {(a+b) total mole}/(mole of trimellitic anhydride) ratio is 1.0/2.0 to 1.0/2.2, and which comprises said diimidedicarboxylic acids represented by the formula (I) and the formula (II)

with (2) said aromatic diisocyanate represented by the formula (III)

so that the {(a+b) total mole)/(mole of said aromatic diisocyanate) ratio is 1.0/1.0 to 1.0/1.5.

17. The metal-clad laminated sheet according to claim 16, wherein the prepreg has said (a/b) being 95/5 to 30/70.

18. The metal-clad laminated sheet according to claim 13, wherein said diamine reacted to form the diimidedicarboxylic acid includes said diamine having three or more aromatic rings, and said diamine having three or more aromatic rings includes 2,2-bis[4-4(4-aminophenoxy)phenyl] propane.

19. The metal-clad laminated sheet according to claim 1, wherein said diamine reacted to form the diimidedicarboxylic acid includes said diamine having three or more aromatic rings, and said diamine having three or more aromatic rings includes 2,2-bis[4-4(4-aminophenoxy)phenyl] propane.

20. The metal-clad laminated sheet according to claim 1, wherein said metal foil is a copper foil or an aluminum foil.

21. The metal-clad laminated sheet according to claim 1, wherein said metal foil is a composite foil.

22. The metal-clad laminated sheet according to claim 1, wherein the surface roughness Rz of the metal foil is Rz≦2.0.

23. The metal-clad laminated sheet according to claim 12, wherein the metal foil has a surface roughness Rz of Rz≦3.0, and wherein said metal-clad laminated sheet is obtained by pressing the prepreg and the metal foil together while heating.

24. The metal-clad laminated sheet according to claim 13, wherein the metal foil has a surface roughness Rz of Rz≦3.0, and wherein said metal-clad laminated sheet is obtained by pressing the prepreg and the metal foil together while heating.

25. The metal-clad laminated sheet according to claim 1, wherein said sheet has said metal foil on opposed surfaces of said prepreg so as to form a double-sided laminated sheet.

26. The metal-clad laminated sheet according to claim 12, wherein said sheet has said metal foil on opposed surfaces of said prepreg so as to form a double-sided laminated sheet.

27. The metal-clad laminated sheet according to claim 13, wherein said sheet has said metal foil on opposed surfaces of said prepreg so as to form a double-sided laminated sheet.

* * * * *